United States Patent [19]

Smith

[11] 3,911,570

[45] Oct. 14, 1975

[54] ELECTRICAL CONNECTOR AND METHOD OF MAKING

[75] Inventor: Baynard R. Smith, North Palm Beach, Fla.

[73] Assignee: Electro Oxide Corporation, Palm Beach Gardens, Fla.

[22] Filed: Aug. 21, 1973

[21] Appl. No.: 390,311

[52] U.S. Cl............ 29/630 D; 29/473.1; 339/278 C

[51] Int. Cl.$^2$........................................... H01R 9/00

[58] Field of Search.... 339/218, 278 C, 17 R, 17 B; 29/630 D, 630 R, 628, 497.5, 498, 484, 473.1, 472.9, 471.9

[56] References Cited

UNITED STATES PATENTS

| | | | |
|---|---|---|---|
| 3,006,069 | 10/1961 | Rhoads et al. | 29/473.1 |
| 3,055,465 | 9/1962 | Pulfrich | 29/473.1 |
| 3,271,852 | 9/1966 | Long | 29/494 |
| 3,309,760 | 3/1967 | Reznick et al. | 29/628 |
| 3,414,964 | 12/1968 | Emeis et al. | 29/473.1 |
| 3,628,234 | 12/1971 | Russell | 29/473.1 |
| 3,766,634 | 10/1973 | Babcock et al. | 29/473.1 |
| 3,780,433 | 12/1973 | Lynch | 29/630 D |

*Primary Examiner*—C. W. Lanham
*Assistant Examiner*—James R. Duzan
*Attorney, Agent, or Firm*—Paul Maleson; Morton J. Rosenberg

[57] ABSTRACT

The method of making an improved electrical connector and the resulting article of manufacture. The invention is directed to an improved method of bonding connector pins within a ceramic substrate to form a high strength force resistant bond therebetween. A bonding mixture is formed whereby between 0.5 to 10.0 parts by weight of copper within copper oxide particulates are mixed with 1.0 parts of silver within silver or silver oxide paticulates. In one form of the invention, the bonding mixture is formed into a pasty consistency by the addition of an organic binder. The mixture is then placed contiguous to openings formed in the ceramic substrate. Connector pins are inserted in the openings and the connector assembly is fired in an air or inert atmosphere at a predetermined temperature within the range 950° to 1010°C. The resulting bond between connector pins and ceramic substrate is highly force resistant. In another form of the invention, the bonding mixture is added to a molding resin. The combination is then cast into bonding sheets. The sheets are stamped out in a contour dimension equal to the ceramic substrate. The bonding sheets are placed contiguous to the ceramic substrate surface and the connector pins are inserted into substrate openings. The connector assembly is then fired as previously described to form the improved bond strength electrical connector.

13 Claims, No Drawings

ELECTRICAL CONNECTOR AND METHOD OF MAKING

BACKGROUND OF THE INVENTION

1. Field of the Invention

This invention pertains to improvements in the construction of electrical circuits. In particular, this invention relates to improved electrical connectors and methods of making such. More in particular, this invention relates to an improved bonding method between the ceramic substrate and inserted connector pins of an electrical connector assembly. Still, further, this invention pertains to the use of a predetermined percentage mixture of copper oxide and silver bonding mixture which when fired within a predetermined temperature range causes a highly force resistant bond to be formed between the ceramic substrate and the connector pins of an electrical connector where the bonding mixture forms an intermetallic compound which wets the ceramic and metallic pin elements.

2. Prior Art

Electrical connectors are well known in the art. Further, electrical connectors having a ceramic substrate with openings for insertion of connector pins are also well known in the art. One prior method of forming electrical connectors is metalizing the ceramic substrate surface with a metalized pattern being placed around the holes. In such prior methods, the metalizing compounds used are generally gold-palladium, gold-platinum or silver-palladium which are transferred to the ceramic substrate through silk screening or some like technique. The metalizing compound is fired in an air atmosphere and then the connector pins are inserted into the substrate holes and are soldered to the metalized portion of the ceramic substrate. However, in the use of such prior techniques, where precious metal compounds are used, the soldering must be done quickly or a scavenging action occurs which dissolves away the metalized coating. Further, the use of such prior techniques is complex and greatly increases the cost of manufacture of the electrical connectors being produced. Additionally, where Kovar connector pins are used (manufactured by Westinghouse Corp.), they must be plated with nickel, gold, or some like plating which may then be soldered. This once again increases the cost and complexity of producing the electrical connectors.

Another prior method of bonding connector pins to a ceramic substrate to produce an electrical connector is through refractory metal metalization. In such prior methods, tungsten or like metal is printed on the ceramic substrate, fired in a reducing atmosphere and electro-plated with nickel on the metallized printed pattern. Kovar connector pins are inserted into the ceramic substrate and a copper-silver brazing alloy or some like compound is added to the connector assembly. The assembly is then fired in a reducing atmosphere to the temperature of the melting point of the brazing material. In such prior methods, the metalized ceramic substrate must be electro-plated and fired in a reducing atmosphere. Such prior methods increase the complexity of producing the electrical connector and the manufacturing costs involved. Additionally, a great amount of handling of the electrical connector assembly is required which lowers the quality assurance rating of such prior produced assemblies.

Additionally, in prior methods of bonding connector pins to ceramic substrates, the bond strength is less than that of the present invention. Thus, in some prior cases, high impact forces applied to the electrical connector assembly may loosen the connector pins within the ceramic substrate. This would have a disastrous effect on the electrical circuit and possibly cause a malfunction. Other disadvantages arising from use of such prior methods includes the possibility of voids occuring at the site of the connector pin/circuit interface thus causing a failure in the circuit.

SUMMARY OF THE INVENTION

An object of the present invention is to produce an improved electrical connector assembly.

Another object of the subject invention is to provide a highly force resistant bond between the ceramic substrate and inserted connector pins of an electrical connector.

A still further object of the instant invention is to provide an electrical connector wherein bonding between the connector pins and a ceramic substrate is accomplished in a one step firing process.

An object of this is to provide an electrical connector assembling utilizing a bonding mixture between the ceramic substrate and the connector pins which only requires firing in an air or inert atmosphere.

Another object of the present invention is to provide an electrical connector which is devoid of complex steps in the manufacture thereof.

A still further object of the instant invention is to provide an electrical connector which is of low cost A method of bonding connector pins within a ceramic substrate member to form an electrical connector. The method includes the step of combining copper oxide and at least one material from the group consisting of silver and silver oxide in predetermined quantities to form a bonding mixture. The bonding mixture is placed on the ceramic substrate member contigious to at least one opening formed within the ceramic substrate member. At least one connector pin is inserted within the opening to form a connector assembly. The connector assembly is fired within a predetermined temperature range to form a bond between the connector pin and the ceramic substrate.

DESCRIPTION OF THE PREFERRED EMBODIMENT

In accordance with the instant invention hereinafter to be described, there is provided a method of bonding connector pins within a ceramic substrate to form an electrical connector. The method and resulting article of manufacture provides for an electrical connector with connector pins rigidly secured to the ceramic substrate. Utilization of the bonding method has produced electrical connectors wherein removal of the connector pin members is only facilitated through destruction of the connector pins and/or the ceramic substrate. Further, the resulting ceramic based connector has been found to be less complex to manufacture and costs less to produce than electrical connectors being made previously.

The basic components of the electrical connector device as pertaining to the subject inventive concept are the connector pins and the substrate to which they are bonded. The substrate is in general a ceramic substrate and preferably being either aluminum oxide or beryllium oxide, both of which are commonly used in the production of electrical connectors. The connector pins commonly used in the art are generally nickel-iron based alloys, one of which having been used successfully with relation to the subject invention being Kovar, produced by Westinghouse Corp., Westinghouse Specialty Metals Division. However, other metal connector pins may be used with the basic restriction being that they be able to withstand the imposed firing temperatures without melting.

The initial step in one embodiment of the method invention is in the combining of copper oxide (cupric oxide or cuprous oxide) with either silver or silver oxide in predetermined weight percentages to form a bonding mixture. Both the copper oxide and silver material are in the form of fine particulates. The weight ratio of copper to silver is between 0.5 and 10.0 parts of copper to 1.0 part of silver, and preferably between 1.65 to 1.80 parts of copper to 1.0 part of silver.

The copper oxide and silver particles are formed into a pasty constituency by the addition of a commercially available organic binder. The weight percentage of the organic binder has not been found to be critical to the inventive concept as herein described however, organic binder weight percentages of between 10.0 and 95.0 percent of the total weight of copper oxide, silver material, and organic binder have been used successfully. Organic binders such as beta terpinol, ethyl cellulose mixture, pine oil, methyl cellulose or like compositions may be used. In actual practice, commercially available organic binders have been used including, Ferro Vehicle Corp. binder H–216, Alpha Metals Corp. binder Reliafilm No. 5181 and L. Reusche and Co. binder Medium No. 163-C.

The particulates of copper oxide (cupric oxide or cuprous oxide), silver oxide which are mixed together have a fine powder texture and are preferably in the sub-micron dimensional size. Such particulate mixes may be commercially obtained or produced through standard milling or grinding operations, well known in the art.

If necessary, the copper oxide (cupric oxide, cuprous oxide) particles may be reduced in size by incorporating initial large particles into toluol, benzene, alcohol, acetone or some like composition to form a conglomerate mixture. This mixture may be ball milled or passed through some like technique for a time (between 2 and 24 hours) sufficient to break down the copper oxide particulates to the fine powder texture. The mixture is then dried in a standard oven until the copper oxide powder is substantially devoid of volatile material. In practice, the oven has been maintained at a temperature approximating 1000° C., for between one-half and 5 hours dependent upon the weight of mixture being dried. The oven or other drying mechanism temperature and the time of drying is not critical to the inventive concept with the only restriction placed on these parameters being that upon termination of drying, the remaining copper oxide powder be substantially free of the volatile material (i.e., tolual, benzene, alcohol, acetone or like compositions).

The breaking of the copper oxide down to the proper particulate size is not necessary for the silver or silver oxide particle since such are commercially available. In one form of mixture, copper and silver may be atomized to form an alloy of copper/silver in the proper weight percentages. In any event, the bonding mixture of copper oxide and silver or silver oxide particulates are then incorporated into the organic binder as previously described to form a pasty bonding mixture.

The pasty bonding mixture is then placed on the ceramic substrate contiguous to the holes or openings located to receive the connector pins. The bonding mixture may be manually located around the openings, injected into the substrate surface with a hypodermic needle or some like technique. The connector pins may then be inserted into appropriate openings in the ceramic substrate to form a relatively loose fitting connector assembly.

The connector assembly is then fired in air or inert atmosphere within the temperature range of 950° to 1010°C. The bonding mixture was found to flow into the clearance between the connector pins and the openings formed in the ceramic substrate. During the firing step, substantially all of the organic binder is found to be driven off into the surrounding environment with possibly only a residual amount left on the substrate or connecting pins. It has been observed that portions of copper oxide particles impregnate both the ceramic substrate and the connector pins. In the manner described, a highly force resistant bond is formed between the connector pins and the ceramic substrate.

In an embodiment of the invention, the bonding mixture of copper oxide (cupric oxide or cuprous oxide) and silver or silver oxide particulates are mixed together in the previously described manner. Similarly, the weight ratio of copper oxide to silver or silver oxide corresponds to 0.5 to 10.0 parts of copper to 1.0 part of silver. The bonding mixture is added to an organic binder or resin which is adaptable to the formation of a mold. One of such binders used successfully to provide a mold comprises a mixture of (a) 20 grams of polyvinyl alcohol, (b) 10 grams of glycerine, and (c) 200 milileters of water. Other types of binders utilizing polyvinyl chloride, polyvinyl alcohol or other resins suitable for molding may be used. Approximately 5.0–6.0 parts by weight of copper oxide and silver of silver oxide bonding mixture were added to 1.0 part of the binder.

The total mixture of the bonding mixture and binder is then molded or cast into sheets. The sheets are air dried either by natural or forced convection to form a solid flexible sheet film. The film sheet may then be stamped out to make a preform slightly in excess of holes formed in the substrates. The preforms are then mated in contiguous contact to the surface of the ceramic substrate, after the connector pins have been inserted into respective openings.

Alternatively, the preforms may be made by mixing the particulates (copper oxide and silver) with a stearate such as stearic acid for lubrication purposes. This mixture is then inserted into a compacting press and contoured to a predetermined shape corresponding to the substrate openings and pin diameters through die compaction.

The combination of ceramic substrate, connector pins and preforms or cut sheet is then fired in an air or inert atmosphere at a predetermined reaction temperature between 950° and 1010°C. As in the preferred embodiment of the invention, the bonding mixture was found to flow into the clearance space between the connector pins and the openings formed in the ceramic substrate. Upon cooling to ambient environmental conditions, it was found that a strong force resistant bond was created between the connector pins and ceramic substrate.

In some cases, following the firing step, the connector pins have been found to be oxidized. The pins may then be cleaned by standard chemical or acid etching or like techniques. Common acids such as hydrochloric acid and sulfuric acid have been successfully used in cleaning the connector pins after firing.

It is to be understood that the method steps as herein described may be taken out of consecutive order in a manner so as to produce substantially the same bonding mechanism between the connector pins and the ceramic substrate. Thus, the method steps as herein detailed results in an improved electrical connector which has strong force resistant bonding between the connector pins and the ceramic substrate.

The following examples illustrate the use of the combination of copper oxide and silver to form a superior bond between the ceramic substrate and the connector pins. Each of the examples set forth the basic formulations of the metalizing compositions used in the invention. In each example the copper oxide used was both cuprous oxide and cupric oxide. For each example, both silver and silver oxide were used. Therefore, for each example, four separate tests were made; (1) cuprous oxide combined with silver, (2) cuprous oxide combined with silver oxide, (3) cupric oxide combined with silver, and (4) cupric oxide combined with silver oxide. In all example cases when the four different combinations were run, all other parameters were held constant. Use of the different combinations led to substantially the same results for each example test and for the sake of brevity, each example may be assumed to represent four tests on the above referenced combinations. In all of the examples the weight parts refers to the copper content of the copper oxide and the silver content of the silver and silver oxide material.

EXAMPLE 1

| | parts by wt. |
|---|---|
| Copper oxide | 1.70 |
| Silver (silver oxide) | 1.0 |

The copper oxide was blended with the silver material as was previously disclosed. The blend was added to an organic binder, in this test being Medium No. 164–C produced by L. Reusche and Co. The weight percentage of the organic binder was approximately 20.0 percent of the copper oxide and silver material combination. A pasty mixture was formed and placed contiguous to the pre-formed openings in the ceramic substrate being used. The placement was through use of a hypodermic needle. Connector pins were inserted in the openings and the assembly was fired in an air atmosphere at 1000°C. Upon cooling, the bond was found to have a highly force resistant property. The ceramic substrate had to be destroyed in order to remove the connector pins. The resultant bond showed excellent crystalline growth of the reaction product, Crystalline impregnation of the ceramic substrate was clearly visible.

In the same example, a separate quantity of copper oxide and silver were added to an organic molding resin. The molding resin comprised a mixture of 20.0 grams of polyvinl alcohol, 10 grams of glycerine, and 200 milliliters of water. The total mixture was cast in sheets, air dried and cut out to conform with the ceramic substrate opening dimensions. The preforms were placed on the ceramic substrate surfaces after the connector pins were inserted. Firing occured at 1000°C. in an air atmosphere with a resulting excellent bond produced.

EXAMPLE 2

| | wt. by parts |
|---|---|
| Copper oxide | 0.5 |
| Silver (Silver oxide) | 1.0 |

The copper oxide was blended with the silver material as previously disclosed. The blend was added to medium No. 163-C which comprised approximately 15.0 percent of the copper oxide and silver material combination by weight. A pasty mixture was formed and inserted on the ceramic substrate prior to insertion of the connector pins. The assembly was fired at 990°C., in an air atmosphere. Upon cooling, an excellent bond was formed, however excess silver particles were observed. Casting of the bonding mixture into preforms as previously described resulted in the same type of bonding.

EXAMPLE 3

| | Wt. by parts |
|---|---|
| Copper oxide | 3.5 |
| Silver (Silver Oxide) | 1.0 |

The copper oxide was blended with the silver material as previously disclosed. Organic binder was added and the total mixture was applied to the areas around the openings formed in the ceramic substrate. Upon firing at 1010°C., particles of copper oxide were noted. Crystalline growth was observed and the bond strength was good. Casting of the bonding mixture into sheets as disclosed in example 1 resulted in the same type of bond.

EXAMPLE 4

| | Wt. by parts |
|---|---|
| Copper Oxide | 5.0 |
| Silver (Silver Oxide) | 1.0 |

The copper oxide was blended with the silver material (both silver and silver oxide were used). Organic binder (as previously disclosed) was added and the total mixture was applied to the areas around the openings formed in the ceramic substrate. Upon firing at 1000°C., and upon subsequent cooling a good bond was observed. Fine crystals were seen and no excess free silver was found.

EXAMPLE 5

| | Wt. by parts |
|---|---|
| Copper Oxide | 10.0 |
| Silver (Silver Oxide) | 1.0 |

As in all the tests run, copper oxide was blended with the silver material and organic binder added. The total mixture was applied to the areas around the openings formed in a ceramic substrate. Firing occurred at 1000°C. and after cooling, a bond was seen to have been formed. The bond scratched easily and was soft, however, crystals were formed and no excess silver was seen.

EXAMPLE 6

| | Wt. by parts |
|---|---|
| Copper Oxide | 2.0 |
| Silver (Silver Oxide) | 1.0 |

Copper oxide and silver material were blended with an organic binder-previously described. The mixture was applied to a ceramic substrate in the usual manner and fired at 950°C. After cooling, large crystals were observed with a small amount of free silver seen, and a good bond was found to have been formed.

It is to be understood that the foregoing description including the specific examples of this invention is made by way of example only and is not to be considered as a limitation of its scope.

What is claimed is:

1. A method of bonding connector pins within a ceramic substrate member to form an electrical connector including the steps of:

a. establishing a weight ratio of between 0.5–10.0 parts of copper oxide powder to 1.0 parts of one material from the group consisting of silver and silver oxide powder;

b. combining said copper oxide powder and said material from the group consisting of said silver and silver oxide to form a bonding mixture;

c. placing said bonding mixture on said ceramic substrate member contiguous to at least one opening formed within said ceramic substrate member;

d. inserting at least one connector pin within said opening to form a connector assembly; and, e. firing said connector assembly within a temperature range between approximately 950° to 1010°C. to form a bond between said connector pin and said ceramic substrate.

2. The method of bonding connector pins within a ceramic substrate member as recited in claim 1 where the step of combining includes the step of establishing a weight ratio of between 1.77 parts of copper to 1.0 parts of silver for said bonding mixture.

3. The method of bonding connector pins within a ceramic substrate as recited in claim 1 where said copper oxide is cupric oxide.

4. The method of bonding connector pins within a ceramic substrate as recited in claim 1 where said copper oxide is cuprous oxide.

5. The method of bonding connector pins within a ceramic substrate as recited in claim 1 where the step of firing includes the step of inserting said connector assembly within an inert atmosphere.

6. The method of bonding connector pins within a ceramic substrate as recited in claim 1 where the step of firing includes the step of inserting said connector assembly within an air atmosphere.

7. The method of bonding connector pins within a ceramic substrate as recited in claim 1 where the step of firing said connector assembly is followed by the step of cleaning said bonded connector pins of oxide coatings formed thereon.

8. The method of bonding connector pins within a ceramic substrate as recited in claim 7 where the step of cleaning includes the step of chemical etching said fired connector pins to remove said coating.

9. The method of bonding connector pins within a ceramic substrate as recited in claim 1 where said connector pins are constructed of Kovar.

10. The method of bonding connector pins within a ceramic substrate as recited in claim 1 where the step of combining is followed by the step of forming said bonding mixture into a preform for placement on said ceramic substrate.

11. The method of bonding connector pins within a ceramic substrate as recited in claim 10 where the step of forming includes the step of adding a predetermined weight percentage of organic binder to said bonding mixture.

12. The method of bonding connector pins within a ceramic substrate as recited in claim 11 where the step of adding is followed by the step of casting said bonding mixture into preforms having a contour dimension slightly in excess of the diameters of said openings in said ceramic substrate.

13. The method of bonding connector pins within a ceramic substrate as recited in claim 10 where the step of forming said bonding mixture includes the step of compacting said bonding mixture into a preform having a predetermined contour dimension.

* * * * *